United States Patent
Nishitani et al.

(10) Patent No.: US 11,555,092 B2
(45) Date of Patent: Jan. 17, 2023

(54) COMPOSITION FOR CURABLE RESIN, CURED PRODUCT OF SAID COMPOSITION, PRODUCTION METHOD FOR SAID COMPOSITION AND SAID CURED PRODUCT, AND SEMICONDUCTOR DEVICE

(71) Applicant: ENEOS CORPORATION, Tokyo (JP)

(72) Inventors: Yoshinori Nishitani, Tokyo (JP); Tatsuki Sato, Tokyo (JP); Masaki Minami, Tokyo (JP)

(73) Assignee: ENEOS CORPORATION, Tokyo (JP)

( * ) Notice: Subject to any disclaimer, the term of this patent is extended or adjusted under 35 U.S.C. 154(b) by 0 days.

(21) Appl. No.: 17/264,724

(22) PCT Filed: Aug. 1, 2019

(86) PCT No.: PCT/JP2019/030178
§ 371 (c)(1),
(2) Date: Jan. 29, 2021

(87) PCT Pub. No.: WO2020/027257
PCT Pub. Date: Feb. 6, 2020

(65) Prior Publication Data
US 2021/0301076 A1    Sep. 30, 2021

(30) Foreign Application Priority Data
Aug. 3, 2018 (JP) ............................. JP2018-146918

(51) Int. Cl.
| | | |
|---|---|---|
| C08G 59/50 | (2006.01) | |
| C08G 59/24 | (2006.01) | |
| C08K 3/36 | (2006.01) | |
| C08K 7/18 | (2006.01) | |
| H01L 23/29 | (2006.01) | |

(52) U.S. Cl.
CPC ......... *C08G 59/5046* (2013.01); *C08G 59/24* (2013.01); *C08G 59/5033* (2013.01); *C08G 59/5073* (2013.01); *C08K 3/36* (2013.01); *C08K 7/18* (2013.01); *H01L 23/293* (2013.01); *H01L 23/295* (2013.01)

(58) Field of Classification Search
None
See application file for complete search history.

(56) References Cited

U.S. PATENT DOCUMENTS

| | | | | |
|---|---|---|---|---|
| 4,072,734 A | * | 2/1978 | Nakata ............... | C08K 5/3465 528/421 |
| 4,737,564 A | * | 4/1988 | Goel .................. | C08G 59/686 528/73 |
| 5,319,025 A | * | 6/1994 | Weigelt ............... | C08K 5/3442 525/326.3 |
| 2009/0215967 A1 | * | 8/2009 | Lin ................... | C07F 9/657172 525/390 |
| 2010/0249276 A1 | * | 9/2010 | Dershem ............. | C08L 71/02 548/545 |
| 2013/0199724 A1 | * | 8/2013 | Dershem ............ | C08G 59/1477 556/440 |
| 2016/0222204 A1 | | 8/2016 | Wang et al. | |
| 2019/0119447 A1 | | 4/2019 | Minami et al. | |
| 2020/0024426 A1 | * | 1/2020 | Nishitani ............. | C08G 59/24 |
| 2020/0095422 A1 | * | 3/2020 | Nishitani ............. | C08G 59/56 |
| 2020/0277447 A1 | * | 9/2020 | Kanbara ............. | C09D 175/04 |
| 2020/0291173 A1 | * | 9/2020 | Nishitani ........... | C08G 73/0233 |
| 2020/0308340 A1 | * | 10/2020 | Nishitani ............ | C08G 59/623 |
| 2020/0325270 A1 | * | 10/2020 | Nishitani ............. | C08K 3/36 |
| 2021/0024748 A1 | * | 1/2021 | Lehman .............. | C08L 79/04 |
| 2021/0253783 A1 | * | 8/2021 | Sato .................. | C08G 59/3272 |

FOREIGN PATENT DOCUMENTS

| | | |
|---|---|---|
| JP | H05-194711 A | 8/1993 |
| JP | 2000-351882 A | 12/2000 |
| JP | 2004-203911 A | 7/2004 |
| JP | 2011-140465 A | 7/2011 |
| JP | 2012-067177 A | 4/2012 |
| JP | 2015-535865 A | 12/2017 |
| WO | WO 2017/188448 A1 | 11/2017 |
| WO | WO 2018/105743 A1 | 6/2018 |
| WO | WO 2018/181857 A1 | 10/2018 |

OTHER PUBLICATIONS

Japanese Patent Office, International Preliminary Report of Patentability in International Patent Application No. PCT/JP2019/030178 (dated Feb. 9, 2021).
Japanese Patent Office, International Search Report in International Patent Application No. PCT/JP2019/030178 (dated Oct. 15, 2019).

* cited by examiner

*Primary Examiner* — Megan McCulley
(74) *Attorney, Agent, or Firm* — Leydig, Voit & Mayer, Ltd.

(57) ABSTRACT

The invention provides a curable resin composition containing (A) a multifunctional benzoxazine compound having at least two benzoxazine rings, the compound being at least one multifunctional benzoxazine compound selected from a multifunctional benzoxazine compound having a structural unit of formula (1) and a multifunctional benzoxazine compound represented by a structure of formula (2), (B) a multifunctional epoxy compound having at least one norbornane structure and at least two epoxy groups, (C) a curing agent, and (D) a curing accelerator which is a bisphenol salt of a diazabicycloalkene. The invention also provides a cured product of the curable resin composition and methods of producing the curable resin composition and the cured product, as well as a semiconductor device using the cured product as a sealant.

21 Claims, 1 Drawing Sheet

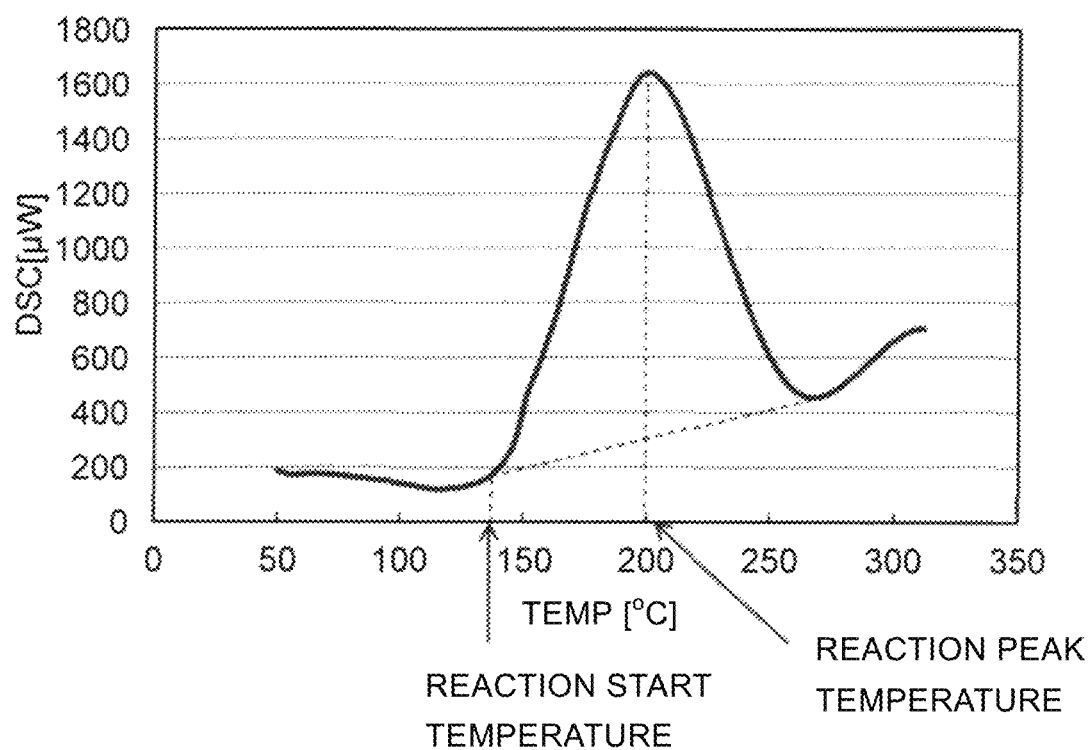

COMPOSITION FOR CURABLE RESIN, CURED PRODUCT OF SAID COMPOSITION, PRODUCTION METHOD FOR SAID COMPOSITION AND SAID CURED PRODUCT, AND SEMICONDUCTOR DEVICE

CROSS-REFERENCE TO RELATED APPLICATIONS

This patent application is the U.S. national phase of International Patent Application No. PCT/JP2019/030178, filed Aug. 1, 2019, which claims the benefit of Japanese Patent Application No. 2018-146918, filed Aug. 3, 2018 which are incorporated by reference in their entireties herein.

TECHNICAL FIELD

The present invention relates to a curable resin composition for obtaining a cured product high in heat resistance, a cured product thereof, and methods of producing the curable resin composition and the cured product.
Furthermore, the present invention relates to a semiconductor device using the cured product as a sealant.

BACKGROUND ART

Curable resins are used in various applications of semiconductor sealants, fiber reinforced plastics, and the like. Conventionally, epoxy resins, phenol resin curing agents and curing accelerators have been used in curable resin compositions. Further, organic phosphine compounds and imidazole compounds are known as the curing accelerators commonly used when curing epoxy resins using phenol resins.

However, in a curable resin composition containing an epoxy resin and a phenol resin curing agent, there are problems that the use of an organic phosphine compound causes an insufficient reaction, resulting in a failure to obtain a cured product having an excellent formability, reliability at a high temperature and crack resistance, and that: the use of an imidazole-based curing accelerator results in a poor fluidity, and a poor storage stability of the obtained sealing resin composition, although being excellent in curability.

For the above mentioned problems, Patent Literature 1 proposes the use of 1,8-diazabicyclo(5.4.0)undecene-7 (DBU) as a curing accelerator, in a curable resin composition containing an epoxy resin and a phenol resin curing agent, from the viewpoint of improving the curability, formability and storage stability.

RELATED ART DOCUMENTS

Patent Literature

[Patent Literature 1] JP 2004-203911 A

SUMMARY OF THE INVENTION

Problems to be Solved by the Invention

The present inventors have developed a curable resin composition containing a benzoxazine compound, a multifunctional epoxy compound, a curing agent and a curing accelerator, in order to obtain a curable resin composition which is excellent in fast curability and whose cured product is excellent in heat resistance.

Benzoxazine compound as used herein refers to a compound containing a benzoxazine ring having a benzene backbone and an oxazine backbone, and a benzoxazine resin as a cured product (polymerized product) thereof are excellent in physical properties such as heat resistance and mechanical strength, and is used as a high-performance material in various applications.

The present inventors have investigated the use of DBU as a curing accelerator for a curable resin composition containing a benzoxazine compound and a multifunctional epoxy compound. As a result, the inventors have discovered new problems in achieving stable production, such as, for example, that it is difficult to control the curing due to too low a reaction start temperature, and that it is difficult to add an accurate amount of DBU in the production process, since DBU is liquid at normal temperature.

Therefore, there is a need for a curable resin composition which can be produced stably, which is excellent in fast curability, and whose cured product is excellent in heat resistance.

Means for Solving the Problems

The present inventors have made intensive studies in order to achieve the above objects, and as a result, have developed a curable resin composition containing a multifunctional benzoxazine compound, a multifunctional epoxy compound, a curing agent, and a curing accelerator which is a bisphenol salt of a diazabicycloalkene, and have found out that the curable resin composition is excellent in fast curability, and a cured product of the composition is excellent in heat resistance, thereby leading to completion of the present invention.

That is, the present invention is as follows.

[1] A curable resin composition, containing:

(A) a multifunctional benzoxazine compound having at least two benzoxazine rings, the compound being at least one multifunctional benzoxazine compound selected from a multifunctional benzoxazine compound having a structural unit of formula (1) and a multifunctional benzoxazine compound represented by a structure of formula (2), (B) a multifunctional epoxy compound having at least one norbornane structure and at least two epoxy groups, (C) a curing agent, and (D) a curing accelerator which is a bisphenol salt of a diazabicycloalkene;

[Chem. 1]

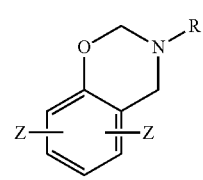

(1)

wherein in the formula (1), R represents a linear alkyl group having 1 to 12 carbon atoms, a cyclic alkyl group having 3 to 8 carbon atoms, or an aryl group having 6 to 14 carbon atoms, where the aryl group optionally has halogen or a linear alkyl group having 1 to 12 carbon atoms, as a substituent; and each Z represents hydrogen, a hydrocarbon group having 1 to 8 carbon atoms and/or a linking group and is optionally the same or different, at least one Z represents a linking group, and benzoxazine rings are linked by the linking group;

[Chem. 2]

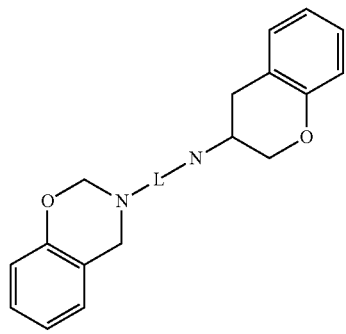

(2)

wherein in the formula (2), L represents a divalent organic group having 1 to 5 aromatic rings or an alkylene group having 1 to 10 carbon atoms, and the organic group and the alkylene group optionally comprise oxygen and/or sulfur.
[2] The curable resin composition according to [1], wherein the curing accelerator (D) is represented by a structure of formula (9) or (10):

[Chem 3]

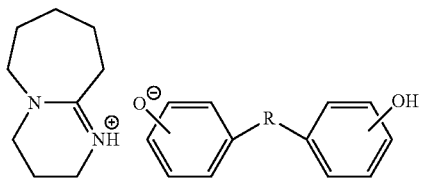

(9)

wherein in the formula (9), R represents an alkylene group optionally having a substituent, a carbonyl group, a sulfonyl group or a sulfide bond (—S—);

[Chem 4]

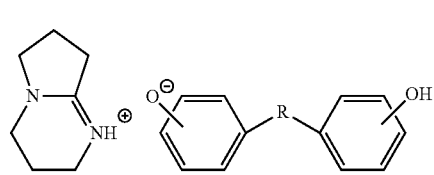

(10)

wherein in the formula (10), R represents an alkylene group optionally having a substituent, a carbonyl group, a sulfonyl group or a sulfide bond (—S—).
[3] The curable resin composition according to [1] or [2], further containing (E) an inorganic filler.
[4] The curable resin composition according to any one of [1] to [3], wherein the curing agent (C) is at least one selected from the group consisting of imidazoles, aromatic amines and multifunctional phenols.
[5] A cured product obtained by curing the curable resin composition according to any one of [1] to [4].

[6] A semiconductor device, wherein a semiconductor element is disposed in a cured product obtained by curing the curable resin composition according to any one of [1] to [4].
[7] A method of producing a curable resin composition, the method comprising the steps of:
mixing
(A) a multifunctional benzoxazine compound having at least two benzoxazine rings, the compound being at least one multifunctional benzoxazine compound selected from a multifunctional benzoxazine compound having a structural unit of formula (1) and a multifunctional benzoxazine compound represented by a structure of formula (2),
(B) a multifunctional epoxy compound having at least one norbornane structure and at least two epoxy groups,
(C) a curing agent, and
(D) a curing accelerator which is a bisphenol salt of a diazabicycloalkene,
to obtain a mixture; and
processing the mixture into a powdery, pelletized, or granular curable resin composition;

[Chem 5]

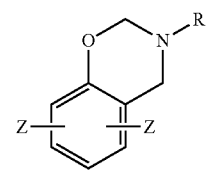

(1)

wherein in the formula (1), R represents a linear alkyl group having 1 to 12 carbon atoms, a cyclic alkyl group having 3 to 8 carbon atoms, or an aryl group having 6 to 14 carbon atoms, where the aryl group optionally has halogen or a linear alkyl group having 1 to 12 carbon atoms, as a substituent; and each Z represents hydrogen, a hydrocarbon group having 1 to 8 carbon atoms and/or a linking group and is optionally the same or different, at least one Z represents a linking group, and benzoxazine rings are linked by the linking group;

[Chem 6]

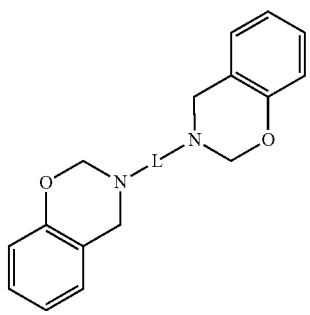

(2)

wherein in the formula (2), L represents a divalent organic group having 1 to 5 aromatic rings or an alkylene group having 1 to 10 carbon atoms, and the organic group and the alkylene group optionally comprise oxygen and/or sulfur.
[8] The production method according to [7], wherein the step of obtaining a mixture includes further mixing (E) an inorganic filler to obtain the mixture.

[9] A method of producing a cured product, the method comprising a step of heating the curable resin composition produced by the method according to claim [7] or [8], at 180 to 300° C., for curing.

Effects of the Invention

The curable resin composition of the present invention is a novel curable resin composition containing components (A) to (D), and further, if desired, a component (E). The curable resin composition is characterized by being excellent in fast curability, while a cured product thereof has a high glass transition temperature and is excellent in heat resistance. Accordingly, the curable resin composition of the present invention can be used in applications where heat resistance is needed while requiring fast curability, for example, applications of adhesives, sealants, paints, and matrix resins for composite materials. In particular, the curable resin composition can not only allow a semiconductor element sealant to exert excellent sealing performance, but also can contribute to high reliability of a semiconductor device.

Further, according to the method of producing a cured product of the present invention, a cured product which has an excellent performance as described above and which can be used in the above described applications can be produced within a short period of time.

BRIEF DESCRIPTION OF THE DRAWINGS

FIG. 1 is a chart showing the reaction start temperature and the reaction peak temperature in a measured result of typical differential scanning calorimetry (DSC).

MODE FOR CARRYING OUT THE INVENTION

[Curable Resin Composition]

Hereinafter, the present invention will be described in detail. It is noted that each "compound" in the components (A) and (B) in the present invention encompasses not only a monomer represented by each formula, but also an oligomer obtained by polymerization of a small amount of the monomer, namely, a prepolymer before formation of a curable resin.

(Component A)

The component (A) that constitutes the curable resin composition is at least one multifunctional benzoxazine compound having at least two benzoxazine rings, selected from a multifunctional benzoxazine compound having a structural unit of formula (1) and a multifunctional benzoxazine compound represented by a structure of formula (2). Herein, in the above described formula (1), each Z represents hydrogen, a substituent and/or a linking group (spacer) and is optionally the same or different, at least one Z represents a linking group, and benzoxazine rings are linked by the linking group. The linking group as used herein encompasses two benzoxazine rings directly bound via no other group. Examples of the substituent include a hydrocarbon group having 1 to 8 carbon atoms.

Accordingly, the formula (1) represents the structural unit of any compound where two or more benzoxazine rings are linked at a benzene ring moiety, among options of the component (A).

The multifunctional benzoxazine compound of formula (1) can be more specifically represented as having a structure represented by Formula (1a):

[Chem 7]

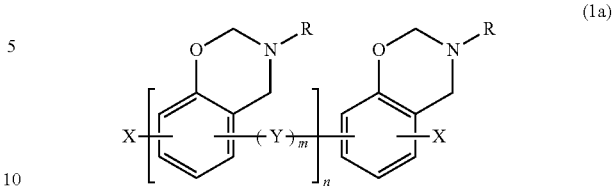

wherein in the formula (1a), R represents a linear alkyl group having 1 to 12 carbon atoms, a cyclic alkyl group having 3 to 8 carbon atoms, or an aryl group having 6 to 14 carbon atoms, where the aryl group optionally has halogen or a linear alkyl group having 1 to 12 carbon atoms, as a substituent; each R is optionally the same as or different; each X represents hydrogen or a hydrocarbon group having 1 to 8 carbon atoms, and is optionally the same or different; Y represents an alkylene group having 1 to 6 carbon atoms, oxygen, sulfur, an $SO_2$ group, or a carbonyl group; m is 0 or 1; and n is an integer from 1 to 10.

Specific examples of R in formulae (1) and (1a) can include the following groups.

Examples of the linear alkyl group having 1 to 12 carbon atoms include a methyl group, an ethyl group, a propyl group, an isopropyl group, an n-butyl group, an isobutyl group, and a t-butyl group.

Examples of the cyclic alkyl group having 3 to 8 carbon atoms include a cyclopentyl group and a cyclohexyl group.

Examples of the aryl group having 6 to 14 carbon atoms include a phenyl group, a 1-naphthyl group, a 2-naphthyl group, a phenanthryl group, and a biphenyl group.

The aryl group having 6 to 14 carbon atoms is optionally substituted, and examples of the substituent include a linear alkyl group having 1 to 12 carbon atoms, or halogen. Examples of the aryl group having 6 to 14 carbon atoms, substituted with a linear alkyl group having 1 to 12 carbon atoms or halogen, include an o-tolyl group, a m-tolyl group, a p-tolyl group, a xylyl group, an o-ethylphenyl group, a m-ethylphenyl group, a p-ethylphenyl group, an o-t-butylphenyl group, a m-t-butylphenyl group, a p-t-butylphenyl group, an o-chlorophenyl group, and an o-bromophenyl group.

R is preferably selected from a methyl group, an ethyl group, a propyl group, a phenyl group and a p-tolyl group, from the viewpoint of favorable handleability.

The component (A) may also be a mixture of a plurality of kinds of compounds represented by formula (1) or (1a), which are different in R from each other.

Examples of the hydrocarbon group having 1 to 8 carbon atoms in formulae (1) and (1a) include an alkyl group, an aryl group and an aralkyl group, and an aryl group is preferred.

Examples of the multifunctional benzoxazine compound represented by formula (1) or (1a) can include a compound represented by the following formula (1X), and an oligomer obtained by polymerization of small amounts of the compound.

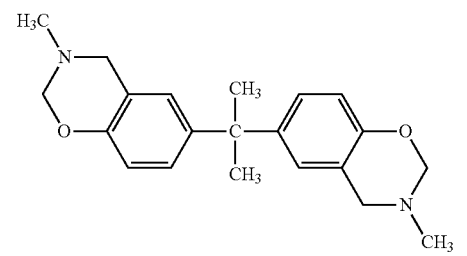
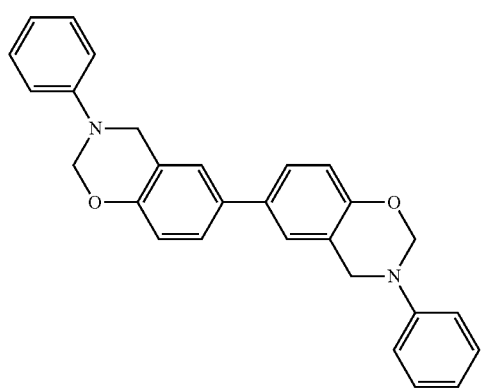
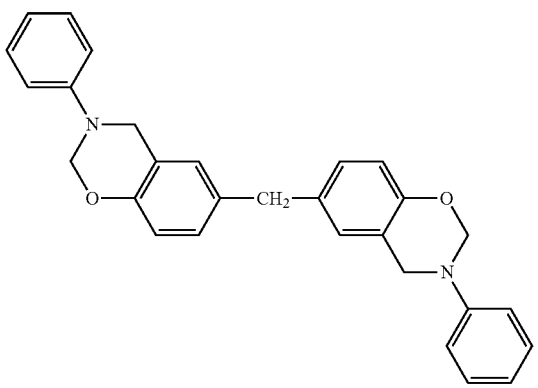
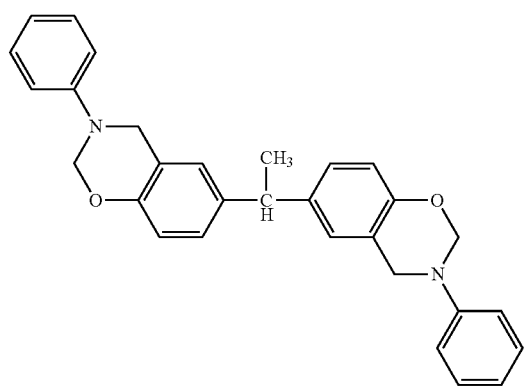
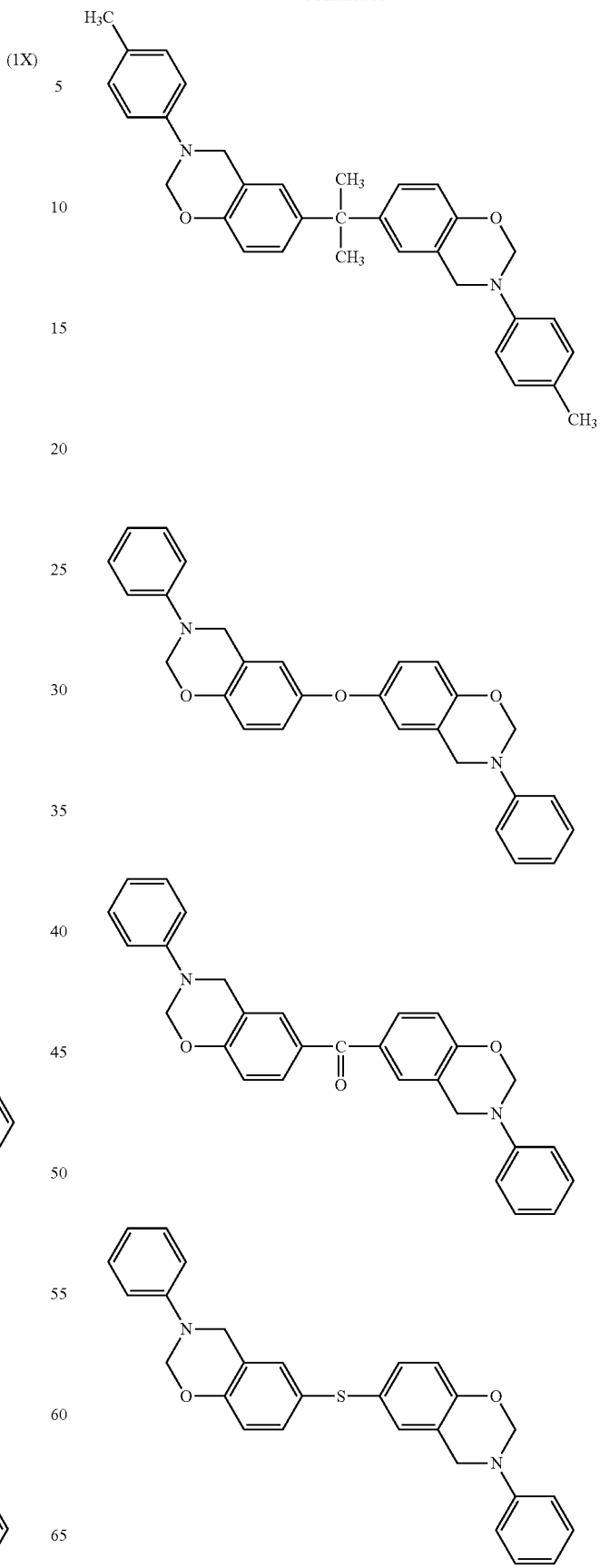

-continued

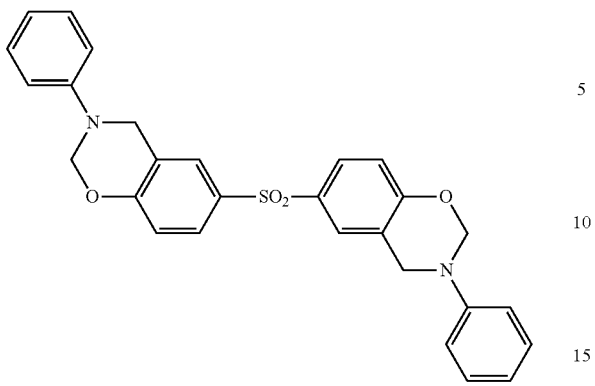

The multifunctional benzoxazine compound of formula (2), as the other option of the component (A), is a compound where respective nitrogen atoms (N atoms) in two benzoxazine rings are bound via a linking group L,

[Chem 9]

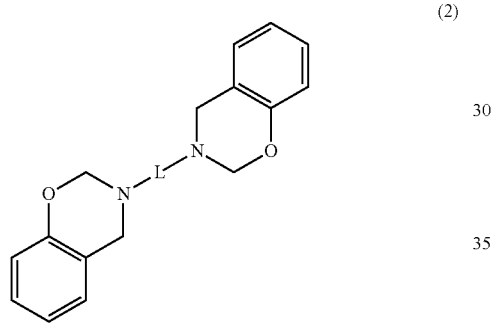

(2)

wherein in the formula (2), L represents a divalent organic group having 1 to 5 aromatic rings or an alkylene group having 1 to 10 carbon atoms, and the organic group and the alkylene group optionally comprise oxygen and/or sulfur.

The composition of the present invention may contain a plurality of kinds of multifunctional benzoxazine compounds represented by formula (2), which are different in L, in the component (A).

In the case where L in formula (2) represents an aromatic ring-containing group, the group contains 1 to 5 aromatic rings, and examples thereof include a monocyclic compound, a multicyclic compound, and a fused ring compound. L may also contain at least one selected from the group consisting of oxygen and sulfur.

Specific examples can include a group represented by the following formula (3).

[Chem 10]

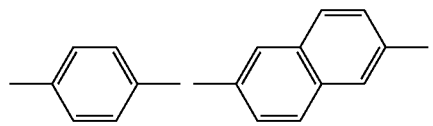

(3)

-continued

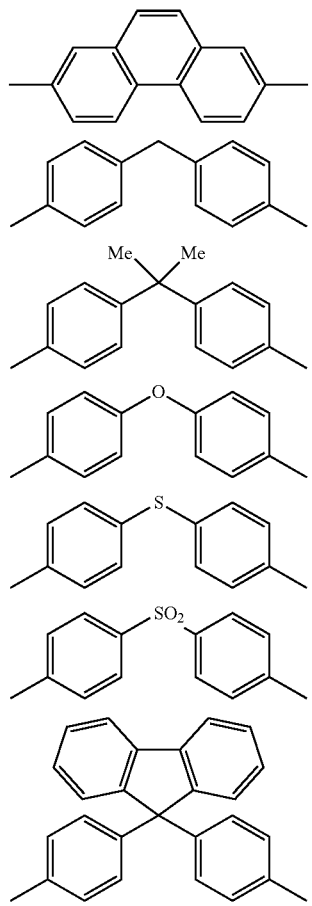

In the case where L in formula (2) represents an alkylene group, the alkylene group has, for example, 1 to 10 carbon atoms, preferably 1 to 6 carbon atoms. Specific examples of the alkylene group include a methylene group, an ethylene group and an isopropylidene group, and preferably include a methylene group.

Examples of the multifunctional benzoxazine compound of formula (2) can include a compound represented by the following formula (2X), and an oligomer obtained by polymerization of the compound, for example, an oligomer obtained by polymerization of small amounts of the compound.

[Chem 11]

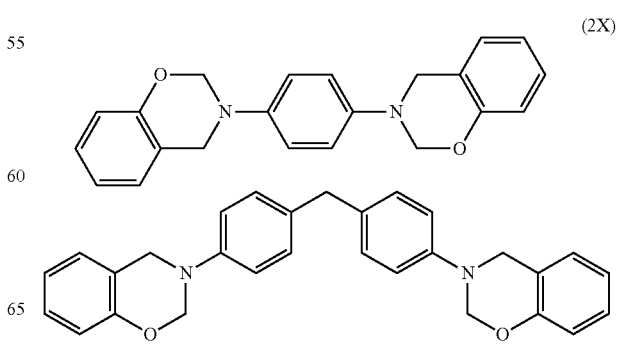

(2X)

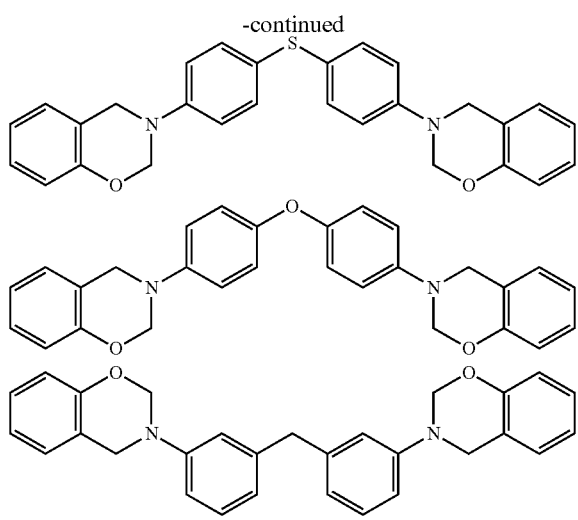

Any commercially available product can also be used as the multifunctional benzoxazine compound in the component (A). Examples of such any commercially available product can include bisphenol F-aniline (F-a)-type benzoxazine and phenol-diaminodiphenylmethane (P-d) type benzoxazine (both are manufactured by SHIKOKU CHEMICALS CORPORATION).

(Component B)

The component (B) that constitutes the curable resin composition is a multifunctional epoxy compound having at least one norbornane structure and at least two epoxy groups (hereinafter, also simply referred to as "multifunctional epoxy compound"). The composition of the present invention may contain a plurality of kinds of the multifunctional epoxy compounds in the component (B). The multifunctional epoxy compound is preferably an alicyclic epoxy compound, and more preferably has an epoxy structure represented by the following Formula (4), bound to a 5-membered ring, a 6-membered ring or a norbornane ring.

[Chem 12]

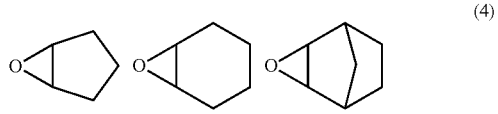

(4)

Specific examples of the multifunctional epoxy compound can include a compound represented by the following formula (5).

[Chem 13]

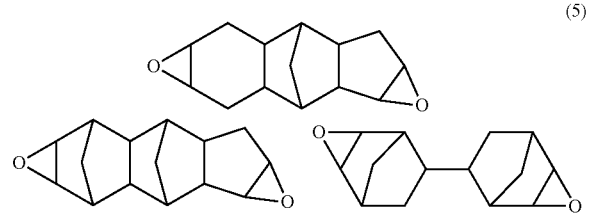

(5)

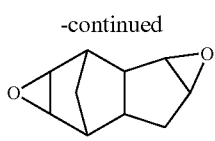

A production example of the multifunctional epoxy compound in the component (B) is described.

A compound of the following Formula (5-1) can be produced by, for example, synthesizing a compound (a) having the following norbornane structure, by a Diels-Alder reaction of butadiene and dicyclopentadiene, and then reacting the compound (a) and meta-chloroperbenzoic acid, as represented in the following formula (6).

[Chem 14]

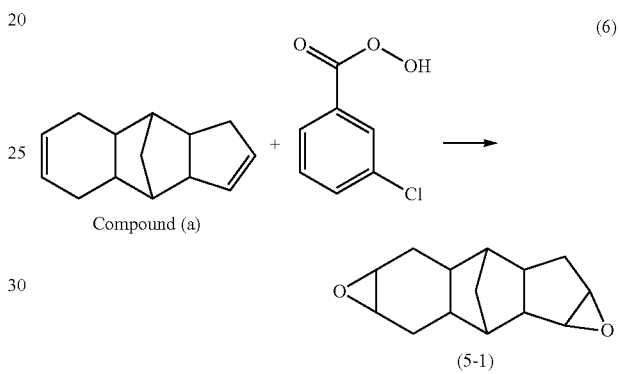

(6)

(5-1)

A compound of the following formula (5-2) can be produced by, for example, synthesizing a compound (b) (tricyclopentadiene) having the following norbornane structure, by a Diels-Alder reaction of cyclopentadiene and dicyclopentadiene, and then reacting the compound (b) and meta-chloroperbenzoic acid, as represented in the following formula (7).

[Chem 15]

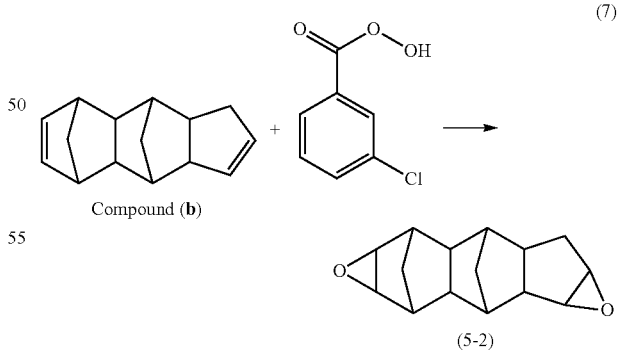

(7)

(5-2)

A compound of the following formula (5-3) can be produced by, for example, synthesizing a compound (c) having the following norbornane structure, by a Diels-Alder reaction of butadiene and cyclopentadiene, and then reacting the compound (c) and meta-chloroperbenzoic acid, as represented in the following Formula (8).

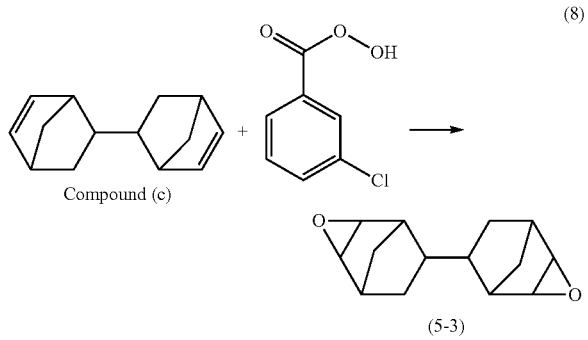

Compound (c)

A compound of the following formula (5-4) can be produced by, for example, reacting dicyclopentadiene and potassium peroxymonosulfate (oxone). The compound of formula (5-4), dicyclopentadiene diepoxide, may also be any commercially available product, and examples of such any commercially available product can include dicyclopentadiene diepoxide manufactured by SHANDONG QIHUAN BIOCHEMICAL CO., LTD.

[Chem 17]

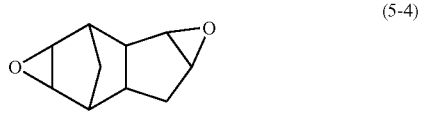

The compounding ratio between the multifunctional benzoxazine compound in the component (A) and the multifunctional epoxy compound in the component (B) is preferably 5 parts by mass or more and 150 parts by mass or less, more preferably 10 parts by mass or more and 100 parts by mass or less, based on 100 parts by mass of the component (A). When the compounding ratio of the component (A) and (B) is in the above range, a favorable heat resistance can be obtained.

In the case where the composition of the present invention contains a plurality of kinds of multifunctional benzoxazine compounds in the component (A), the total of such compounds is assumed to be 100 parts by mass. In the case where the composition of the present invention contains a plurality of kinds of multifunctional epoxy compounds in the component (B), the "compounding ratio of the component (B)" means the total ratio of such a plurality of compounds.

(Component C)

The component (C) that constitutes the curable resin composition is a curing agent. The composition of the present invention preferably contains at least one curing agent selected from imidazoles, aromatic amines, multifunctional phenols and the like, as the component (C). Examples of the component (C) include aromatic amines (for example, diethyltoluenediamine, metaphenylenediamine, diaminodiphenylmethane, diaminodiphenylsulfone, metaxylenediamine, and derivatives thereof), aliphatic amines (for example, triethylenetetramine and isophoronediamine), imidazoles (for example, imidazole and imidazole derivatives), dicyandiamide, tetramethylguanidine, carboxylic anhydrides (for example, methylhexahydrophthalic anhydride), carboxylic acid hydrazides (for example, adipic acid hydrazide), carboxylic acid amides, monofunctional phenols, multifunctional phenols (for example, bisphenol A, bisphenol F, bisphenol sulfides (such as bis(4-hydroxyphenyl)sulfide) and polyphenol compounds), polymercaptans, carboxylates, and Lewis acid complexes (for example, boron trifluoride ethylamine complex). These may be used singly or as a mixture of two or more kinds thereof.

The compounding ratio of the component (C) is preferably in a range of 1 part by mass or more and 30 parts by mass or less, and more preferably in a range of 5 parts by mass or more and 25 parts by mass or less, in terms the compounding ratio of the component (C) based on 100 parts by mass in the total of the components (A) and (B). The component (C) can be contained in such a range, thereby allowing for more efficient progression of a curing reaction, and obtaining a cured product more excellent in heat resistance.

(Component D)

The component (D) that constitutes the curable resin composition is a curing accelerator. The composition of the present invention uses a salt of a diazabicycloalkene and a bisphenol as the component (D). Since DBU or the like is liquid at normal temperature, it is extremely difficult to add it in an accurate amount, in the production process. However, since the bisphenol salt of a diazabicycloalkene is solid at normal temperature (20° C.), an accurate amount thereof can be easily added to the curable resin composition in the production process, and thereby, enabling a stable production. Further, the use of a salt of a diazabicycloalkene and a bisphenol, as the component (D), enables to improve the compatibility of a molten material obtained by melting the components (A), (B), (C) and the like, with the curing accelerator (D). In the case where a solvent is added during the production of the composition, the use of a salt of a diazabicycloalkene and a bisphenol, as the curing accelerator (D), enables to improve the compatibility of a dissolved material obtained by dissolving the components (A), (B), (C) and the like in the solvent, with the curing accelerator (D), The solvent to be used is not particularly limited, as long as the components (A) to (C) can be dissolved therein, and examples thereof include hydrocarbons, ethers, esters and halogen-containing solvents.

Examples of the diazabicycloalkene to be used in the component (D) include 1,4-diazabicyclo(3.3.0)octene-4,1,5-diazabicyclo(4.2.0)octene-5,3-methyl-1,4-diazabicyclo (3.3.0)octene-4,3,6,7,7-tetramethyl-1,4-diazabicyclo(3.3.0) octene-4,1,5-diazabicyclo(4.3.0)nonene-5,1,7-diazabicyclo (4.3.0)nonene-6,1,5-diazabicyclo(4.4.0)decene-5,1,8-diazabicyclo(5.3.0)decene-7,9-methyl-1,8-diazabicyclo (5.3.0)decene-7,1,8-diazabicyclo(5.4.0)undecene-7,1,8-diazabicyclo(7.2.0)undecene-8,1,6-diazabicyclo(5.5.0) dodecene-6,1,8-diazabicyclo(7.3.0)dodecene-8,1,10-diazabicyclo(7.3.0)dodecene-9,1,7-diazabicyclo(6.5.0) tridecene-7,1,8-diazabicyclo(7.4.0)tridecene-8,1,10-diazabicyclo(7.4.0)tridecene-9,1,8-diazabicyclo(7.5.0) tetradecene-8,1,14-diazabicyclo(11.3.0)hexadecene-13, and 1,14-diazabicyclo(11.4.0)heptadecene-13. Among these diazabicycloalkenes, 1,5-diazabicyclo(4.3.0)nonene-5 (D8N) and 1,8-diazabicyclo(5.4.0)undecene-7(DBU) are preferably used.

The bisphenol to be used in the component (D) is a compound having two hydroxyphenyl groups, and examples thereof include 2,2-bis(4-hydroxyphenyl)propane (bisphenol A), 1,1-bis(4-hydroxyphenyl)-1-phenylethane (bisphenol AP), 2,2-bis(4-hydroxyphenyl)hexafluoropropane (bisphenol AF), 2,2-bis(4-hydroxyphenyl)butane (bisphenol B), bis(4-hydroxyphenyl)diphenylmethane (bisphenol BP), 2,2-bis(3-methyl-4-hydroxyphenyl)propane (bisphenol C), bis(4-hydroxyphenyl)-2,2-dichloroethylene (bisphenol C), 1,1-bis(4-hydroxyphenyl)ethane (bisphenol E), bis(4-hydroxyphenyl)methane (bisphenol F), 4,4'-methylenediphenol (MDP), 2,2-bis(4-hydroxy-3-isopropylphenyl)propane (bisphenol G), 1,3-bis(2-(4-hydroxyphenyl)-2-propyl)benzene (bisphenol M), bis(4-hydroxyphenyl)sulfone (bisphenol S), 1,4-bis(2-(4-hydroxyphenyl)-2-propyl)benzene (bisphenol P), 5,5'-(1-methylethylidene)-bis[1,1'-(biphenyl)-2-ol]propane (bisphenol PH), 1,1-bis(4-hydroxyphenyl)-3,3,5-trimethyl-cyclohexane (bisphenol TMC), 1,1-bis(4-hydroxyphenyl)cyclohexane (bisphenol Z), bis(4-hydroxyphenyl)sulfide (TDP), and 4,4'-dihydroxybenzophenone (DHSP).

The bisphenol salt of a diazabicycloalkene in the component (D) is preferably one represented by a structure of formula (9) or formula (10).

In formula (9) and formula (10), the alkylene group preferably has 1 to 10 carbon atoms, more preferably 1 to 6 carbon atoms, and still more preferably 1 to 4 carbon atoms. Specific examples of the alkylene group include a methylene group, an ethylene group and an isopropylidene group, and preferably include a methylene group. The alkylene group may have 1 to 3 aromatic rings, as substituent(s). Further, the alkylene group may contain, in its substituent(s), at least one selected from the group consisting of oxygen, sulfur and halogen. The halogen is preferably fluorine.

The component (D) is preferably a bisphenol salt of DBU or a bisphenol salt of DBN. Specifically, the component (D) is more preferably a bisphenol salt of DBU having a structure represented by the following formula (11), or a bisphenol salt of DBN having a structure represented by the following formula (12). The use of a bisphenol salt of DBU or a bisphenol salt of DBN as the component (D) enables to improve the heat resistance of a cured product of the curable resin composition. Further, the use of a bisphenol salt of DBU or a bisphenol salt of DBN as the component (D) enables to adjust the reaction start temperature of a cured product of the curable resin composition to a suitable level.

[Chem 18]

(11)

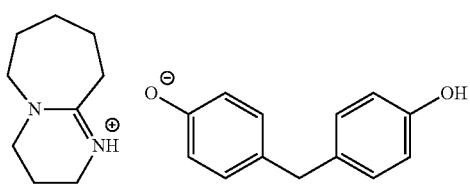

(DBU-MDP)

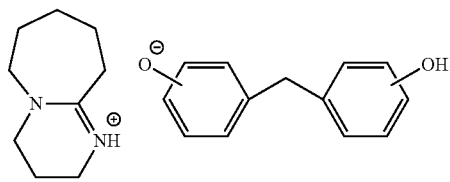

(DBU-BisF)

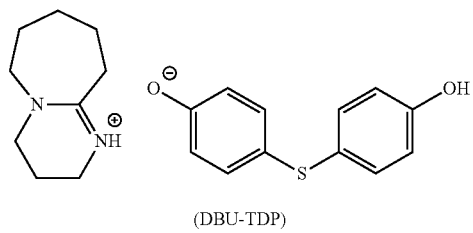

(DBU-TDP)

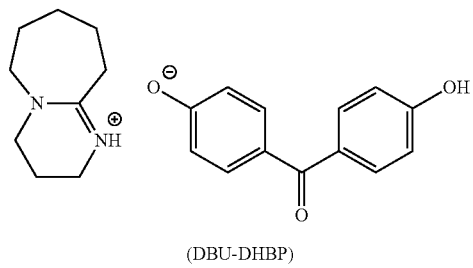

(DBU-DHBP)

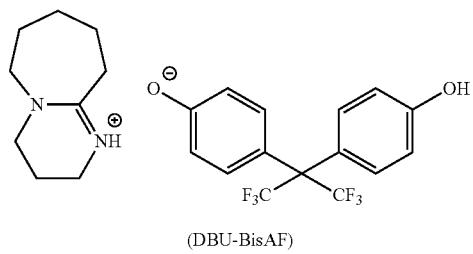

(DBU-BisAF)

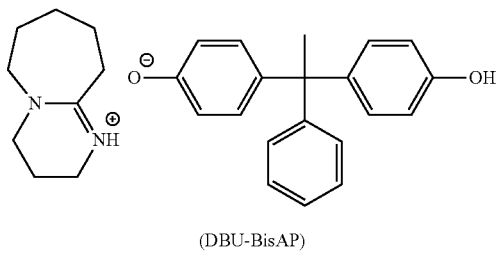

(DBU-BisAP)

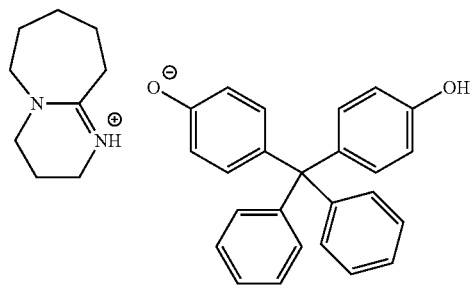

(DBU-BisBP)

[Chem. 19]

(12)

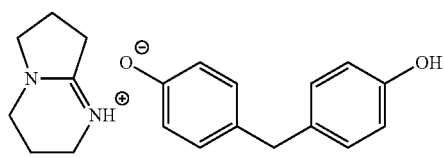

(DBN-MDP)

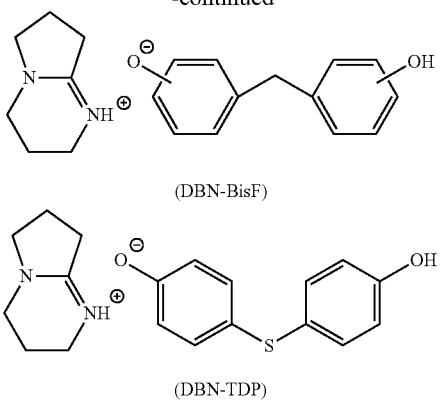

(DBN-BisF)

(DBN-TDP)

The compounding ratio of the component (D) is preferably in a range of 0.01 parts by mass or more and 10 parts by mass or less, in terms the compounding ratio of the component (D) based on 100 parts by mass in the total of the components (A) and (B). The compounding ratio of the component (D) is more preferably in a range of 0.1 parts by mass or more and 7 parts by mass or less. The component (D) can be contained in such a range, thereby obtaining a curable resin composition having a favorable fast curability.

(Component E)

The curable resin composition of the present invention may further contain, if desired, an inorganic filler (E).

For example, in the case of use of the curable resin composition of the present: invention in a sealant application of a semiconductor element or the like, the component (E) is preferably contained. The inorganic filler for use in the present invention is not particularly limited, and can be selected in consideration of an application of the curable resin composition or a cured product thereof, or characteristics to be provided. Hereinafter, the inorganic filler is referred to as "component (E)".

Examples of the component (E) include: oxides such as silica, alumina, titanium oxide, zirconium oxide, magnesium oxide, cerium oxide, yttrium oxide, calcium oxide, antimony trioxide, zinc oxide and iron oxide; carbonates such as calcium carbonate, magnesium carbonate, barium carbonate and strontium carbonate; sulfates such as barium sulfate, aluminum sulfate and calcium sulfate; nitrides such as aluminum nitride, silicon nitride, titanium nitride, boron nitride and manganese nitride; silicon compounds such as calcium silicate, magnesium silicate and aluminum silicate; boron compounds such as aluminum borate; zirconium compounds such as barium zirconate and calcium zirconate; phosphorus compounds such as zirconium phosphate and magnesium phosphate; titanium compounds such as strontium titanate, calcium titanate, magnesium titanate, bismuth titanate, barium titanate and potassium titanate; minerals such as mica, talc, kaolin, kaolin clay, kaolinite, halloysite, cordierite, pyrophyllite, montmorillonite, sericite, amesite, bentonite, asbestos, wollastonite, sepiolite, monolite, zeolite, hydrotalcite, hydrated gypsum, alum, diatomaceous earth and boehmite; fly ash, dewatered sludge, glass beads, glass fibers, silica sand, magnesium oxysulfate, silicon oxide and silicon carbide; metals such as copper, iron, cobalt and nickel, and alloys including any of such metals; magnetic materials such as sendust, alnico magnet and ferrite; and graphite and coke. The component (E) is preferably silica or alumina. Examples of the silica include fused silica, spherical silica, crystalline silica, amorphous silica, synthetic silica and hollow silica, and, among these, spherical silica and crystalline silica are preferred. The component (E) may be used singly, or in combination of two or more kinds thereof.

The component (E) may be particulate, and in such a case, the average particle size thereof is not particularly limited, and may be, for example, 0.01 µm or more and 150 µm or less, preferably 0.1 µm or more and 120 µm or less, and more preferably 0.5 µm or more and 75 µm or less. Such a range leads to an improvement in packing ability into a mold cavity in use of the composition of the present invention in, for example, a sealant application of a semiconductor element. The average particle size of the component (E) can be measured by a laser diffraction/scattering method. Specifically, the average particle size can be determined by creating the particle size distribution of the inorganic filler on a volume basis, with a laser diffraction-type particle size distribution measuring apparatus, and defining the median size as the average particle size. A measurement sample that can be used is preferably obtained by ultrasonically dispersing the inorganic filler in water. The laser diffraction-type particle size distribution measuring apparatus that can be used is, for example, "LA-500", "LA-750", "LA-950" or "LA-960" manufactured by HORIBA LTD.

The compounding ratio of the component (E) is not particularly limited and can be appropriately selected depending on its application, as long as a cured product having a high heat resistance can be obtained. For example, in the case of use of the composition in a semiconductor-sealing application, the following compounding ratio is preferable.

The lower limit value of the compounding ratio of the component (E) is, for example, 150 parts by mass or more, preferably 400 parts by mass or more, and more preferably 500 parts by mass or more, based on 100 parts by mass in total of the components (A), (B), (C) and (D). The upper limit value of the compounding ratio of the component (E) is, for example, 1300 parts by mass or less, preferably 1150 parts by mass or less, and more preferably 950 parts by mass or less. The lower limit value of the compounding ratio of the component (E) is 400 parts by mass or more, thereby enabling an increase in the amount of moisture absorption according to curing of the curable resin composition and a reduction in strength, and thus enabling a cured product having a favorable solder cracking resistance to be obtained. The upper limit value of the compounding ratio of the component (E) is 1300 parts by mass or less, thereby allowing the curable resin composition to have fluidity and thus be easily packed into a mold, resulting in exertion of favorable sealing performance of a cured product.

(Other Component(s))

The composition of the present invention may contain a benzoxazine compound other than the component (A), as long as the effects of the present invention are not impaired. For example, in the case where the composition is demanded to be reduced in viscosity, a monofunctional benzoxazine compound having one benzoxazine ring may be added to the composition.

For example, nano-carbon, a flame retardant, a release agent and/or the like can be compounded into the curable resin composition of the present invention, as long as the performances of the curable resin composition are not impaired.

Examples of the nano-carbon include carbon nanotubes, fullerene, and respective derivatives.

Examples of the flame retardant include red phosphorus; phosphates such as triphenyl phosphate, tricresyl phosphate, trixylenyl phosphate, cresyl diphenyl phosphate, xylenyl diphenyl phosphate, resorcinol bis-phenyl phosphate and bisphenol A bis-diphenyl phosphate; and borates.

Examples of the release agent include silicone oil, stearates and carnauba wax.

In the case of use of the curable resin composition of the present invention in a semiconductor-sealing application, the composition can contain, in addition to the components (A) to (E), one or more of the following, as appropriate, as long as the performances of the curable resin composition are not impaired: colorants such as carbon black, colcothar and titanium oxide; release agents including natural waxes such as carnauba wax, synthetic waxes such as oxidized polyethylene wax, higher fatty acids such as stearic acid, metal salts such as zinc stearate, and paraffins; low-stress additives such as silicone oil and silicone rubber; metal hydroxides such as calcium hydroxide, aluminum hydroxide and magnesium hydroxide; flame retardants such as phosphazene; and the like.

The compounding ratio of the other component(s) is preferably in a range of 0.01 parts by mass or more and 15 parts by mass or less, and more preferably in a range of 0.1 parts by mass or more and 10 parts by mass or less, based on 100 parts by mass in total of the components (A) and (B).

[Method of Producing Curable Resin Composition]

Next, the method of producing the curable resin composition of the present invention will be described.

The curable resin composition of the present invention can be produced by kneading, or by mixing using a mixing apparatus, the components (A) to (D), and further, if desired, the component (E), other component(s) such as other additive(s), and a solvent to be added as appropriate.

The kneading or mixing method is not particularly limited, and the kneading or mixing can be made using, for example, a kneading machine such as a planetary mixer, a twin-screw extruder, a heat roll or a kneader. For example, in the case where the components (A) and (B) are highly viscous liquids or solids at room temperature or in the case where the component (E) is contained, the mixture may be kneaded with heating or further under a pressurized or reduced-pressure condition, if necessary. The heating temperature is preferably 80 to 120° C.

The curable resin composition, which contains the component (E), is solid at room temperature, and thus may be heated and kneaded, and thereafter cooled and pulverized to provide a powder, or the powder may be tabletted and thus formed into pellets. The powder may also be granulated and thus formed Into granules.

In the case where the curable resin composition of the present invention does not contain the component (E), and is used in an application of prepreg for FRP, the curable resin composition preferably has a viscosity of 10 to 3000 Pa·s at 50° C. The viscosity is more preferably 10 to 2500 Pa·s, and still more preferably 100 to 2000 Pa·s. In the case where the curable resin composition of the present invention is used in a sealant or coating application, the viscosity is not particularly limited, as long as working such as sealing or coating is not impaired.

(Characteristics of Curable Resin Composition)

The curing performance of the curable resin composition of the present invention can be measured as thermophysical properties (reaction start temperature and reaction peak temperature) determined by differential scanning calorimetry (DSC). Specifically, the thermophysical properties can be measured using a differential scanning calorimeter, under the conditions of a rate of temperature rise of 10° C./min and a temperature range of 30° C. to 300° C. The temperature at which the graph line starts to rise, in a temperature range of 100° C. or higher, was defined as the reaction start temperature, and the highest point in the graph is defined as the reaction peak temperature. In order to prevent unnecessary reactions from proceeding at a low temperature, the reaction start temperature is preferably 110° C. or higher, more preferably 120° C. or higher, and still more preferably 130° C. or higher; and at the same time, preferably 190° C. or lower, and more preferably 180° C. or lower. From the viewpoint of reactivity, the reaction peak temperature is preferably 195° C. or higher, and more preferably 200° C. or higher; and at the same time, preferably 230° C. or lower, more preferably 220° C. or lower, and still more preferably 215° C. or lower.

The curing performance of the curable resin composition of the present invention can be measured as gel time. The gel time of the curable resin composition as measured at 200° C. is preferably 10 to 60 seconds, and more preferably 20 to 55 seconds, from the viewpoint of fast curability. The gel time can be measured in accordance with the gelation time method B (the flat plate method) defined in JIS K 6910 (2007).

[Cured Product]

The cured product of the curable resin composition of the present invention is characterized by being favorable in heat resistance, being difficult to thermal decomposition, and being high in glass transition temperature. The reason why such an excellent cured product is formed by the curable resin composition of the present invention is considered as follows.

In the homopolymerization of benzoxazine, a phenolic hydroxyl group is first produced by polymerization. It is considered that this phenolic hydroxyl group undergoes keto-enol tautomerization at a high temperature, for example, 200° C. or higher, hereby resulting in cleavage of polymer chains, and thus causing lower heat resistance as well as lower glass transition temperature.

On the contrary, it is considered that the multifunctional epoxy compound having a norbornane structure and two or more epoxy groups, of the present invention, is hardly homopolymerized and reacts with the phenolic hydroxyl group derived from benzoxazine to thereby prevent the cleavage of polymer chains. Thus, the cured product high in heat resistance can be obtained.

(Characteristics of Cured Product) The heat resistance of the cured product of the present invention can be evaluated by measuring the glass transition temperature. The glass transition temperature is preferably 240° C. or higher, and more preferably 250° C. or higher. The glass transition temperature can be measured by differential scanning calorimetry (DSC). Such a measurement can be simply performed by using a commercially available differential scanning calorimeter (for example, one manufactured by HITACHI HIGH-TECH SCIENCE CORPORATION).

[Method of Producing Cured Product]

The cured product of the present invention can be produced by performing ring-opening polymerization for curing, under the same curing conditions as those for known benzoxazine compounds and/or epoxy compounds. Examples include the following methods.

First, the curable resin composition of the present invention is produced by the above method. Subsequently, the resulting curable resin composition can be heated at 180 to 300° C. for one minute to one hour, or for one minute to 5 hours, to obtain a cured product. While a curing time of 1 to 3 minutes or 1 to 6 minutes is sufficient for the continuous production of the cured product, further heating the composition for about 5 minutes to 1 hour, or about 5 minutes to 5 hours, is preferred for achieving a higher strength.

The cured product can also be obtained by compounding a benzoxazine compound other than the component (A) and/or an epoxy compound other than the component (B), as long as the effects of the present invention are not impaired.

In the case where a film-shaped molded product is obtained as the cured product, a solvent can further be compounded to provide a composition which has a suitable solution viscosity for film formation. The solvent is not particularly limited as long as the components (A) to (E) can be dissolved therein, and examples thereof include hydrocarbons, ethers, esters and halogen-containing solvents.

In the case of such a solution-type curable rein composition dissolved in the solvent, the cured product can be obtained by coating a substrate with the solution-type curable rein composition, thereafter volatilizing the solvent, and then performing thermal curing.

[Semiconductor Device]

The semiconductor device of the present invention is a semiconductor device in which a semiconductor element is disposed in a cured product obtained by curing the curable resin composition of the present invention, the composition containing the components (A) to (D), and, if desired, the component (E). The semiconductor element here is usually supported and secured by a lead frame being a thin plate of a metallic material. The phrase "semiconductor element is disposed in a cured product" means that the semiconductor element is sealed by a cured product of the curable resin composition, and represents the state where the semiconductor element is covered with the cured product. In such a case, the entire semiconductor element may be covered, or the surface of the semiconductor element disposed on a base plate may be covered.

In the case where the semiconductor device is produced by sealing any of various electronic components, such as a semiconductor element, with the cured product of the present invention, the semiconductor device can be produced by performing a sealing step according to a conventional molding method, such as transfer molding, compression molding or injection molding.

EXAMPLES

Hereinafter, the present invention will be specifically described with reference to Examples and Comparative Examples; however, the present invention is not intended to be limited to such Examples.

<Component (A); Multifunctional Benzoxazine Compound>

The following compounds (A1) and (A2) were used as the component (A).

(A1); Phenol-diaminodiphenylmethane (P-d)-type benzoxazine represented by the following formula (2-1) (manufactured by SHIKOKU CHEMICALS CORPORATION)

[Chem 20]

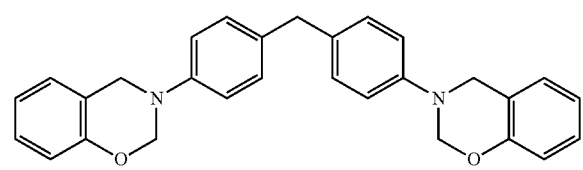

(2-1)

(A2); Bisphenol F-aniline (F-a)-type benzoxazine represented by the following formula (1-1) (manufactured by SHIKOKU CHEMICALS CORPORATION)

[Chem 21]

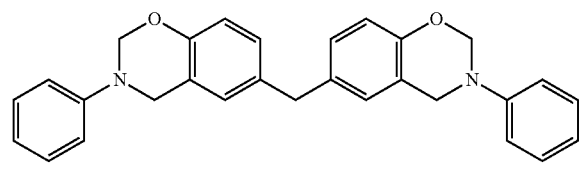

(1-1)

<Component (B); Alicyclic Epoxy Compound>

The following compounds (B1) to (B3) were used as the component (B).

(B1) Alicyclic Epoxy Compound 1; Compound of Formula (5-1)

The compound (a) represented by formula (6) was synthesized according to a method described in "Shoichi Tsuchida et al., "Diels-Alder Reaction between Butadiene and Cyclopentadiene—Determination of Trimers—", Journal of the Japan Petroleum Institute, 1972, Vol. 15, Issue 3, pages 189 to 192".

Next, the reaction of formula (6) was performed as follows. A reaction vessel was charged with 23.5 kg of chloroform and 1.6 kg of the compound (a), and 4.5 kg of meta-chloroperbenzoic acid was added dropwise thereto with stirring at 0° C. The temperature was raised to room temperature, and the reaction was performed for 12 hours.

Next, meta-chlorobenzoic acid as a by-product was removed by filtration, and thereafter, the filtrate was washed with an aqueous 1 N sodium hydroxide solution three times, and then washed with saturated saline. After the organic layer was dried over magnesium sulfate, the magnesium sulfate was removed by filtration and the filtrate was concentrated, to obtain a crude product.

To the crude product was added 2 kg of toluene, to dissolve the crude product at room temperature. Thereto was added dropwise 6 kg of heptane for crystallization, and the resultant was aged at 5° C. for 1 hour. The resulting crystallized product was collected by filtration and washed with hexane. The product was dried under reduced pressure at 35° C. for 24 hours, to obtain 1.4 kg of a compound represented by the following formula (5-1), as a white solid.

[Chem 22]

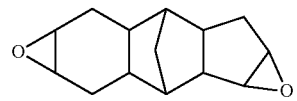

(5-1)

(B2) Alicyclic Epoxy Compound 2; Compound (tricyclopentadiene diepoxide) of Formula (5-2)

The compound (b) was synthesized in the same manner as the compound (a), according to the method described in the above Literature.

Next, the reaction of formula (7) was performed as follows. A reaction vessel was charged with 59.2 kg of chloroform and 4.0 kg of the compound (b), and 10.6 kg of meta-chloroperbenzoic acid was added dropwise thereto with stirring at 10° C. The temperature was raised to room temperature, and the reaction was performed for 12 hours.

Next, meta-chlorobenzoic acid as a by-product was removed by filtration, and thereafter, the filtrate was washed with 42.0 kg of an aqueous 5% sodium sulfite solution. The organic layer was further washed with 41.6 kg of an aqueous 1 N sodium hydroxide solution four times, and then washed with 48.0 kg of saturated saline. After the organic layer was dried over magnesium sulfate, the magnesium sulfate was removed by filtration and the filtrate was concentrated, to obtain 5.1 kg of a crude product.

To the crude product was added 3.5 kg of toluene, to dissolve the crude product at room temperature. Thereto was added dropwise 13.7 kg of heptane for crystallization, and the resultant was aged at 5° C. for 1 hour. The resulting crystallized product was collected by filtration and washed with heptane. The product was dried under reduced pressure at 35° C. for 12 hours, to obtain 2.8 kg of a compound represented by the following formula (5-2), as a white solid.

[Chem 23]

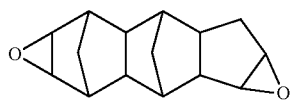

(5-2)

(B3) Alicyclic Epoxy Compound 3; Compound (dicyclopentadiene diepoxide) of Formula (5-4)

A reaction vessel was charged with 10 kg of dicyclopentadiene, 68 kg of sodium bicarbonate, 100 L of acetone and 130 L of ion exchange water, and cooled to 10° C. or lower. Thereafter, while controlling the cooling so that the temperature of the reaction liquid was kept at 30° C. or lower, 84 kg of oxone was gradually added, and the reaction was performed with stirring for 10 hours.

Next, the reaction product was extracted with 100 L of ethyl acetate twice, and the resulting organic layers were fractionated and combined. Subsequently, the combined organic layer was washed with 100 L of a mixed aqueous solution of salt and sodium thiosulfate (20% by weight of salt+20% by weight of sodium thiosulfate), and then further washed with 100 L of ion exchange water twice.

After the washed organic layer was dried over magnesium sulfate, the magnesium sulfate was removed by filtration, and the organic solvent was distilled off from the filtrate, to obtain 11 kg of a compound represented by the following formula (5-4), as a white solid.

[Chem 24]

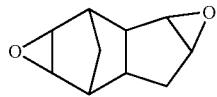

(5-4)

<Component (C); Curing Agent>

The following compounds (C1) and (C2) were used as the component (C).

(C1); Bis(4-hydroxyphenyl)sulfide (TOP) represented by the following formula (manufactured by TOKYO CHEMICAL INDUSTRY CO., LTD.)

[Chem 25]

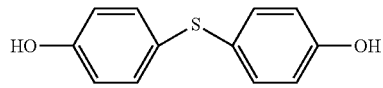

(C2); Bis(4-hydroxyphenyl)methane (bisphenol F) represented by the following formula (manufactured by HONSHU CHEMICAL INDUSTRY CO., LTD.)

[Chem 26]

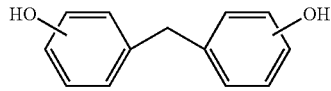

<Component (D); Curing Accelerator>

The following compounds (D1) to (D14) were used as the component (D).

(D1); Salt (TPP-K) represented by the following formula (manufactured by HOKKO CHEMICAL INDUSTRY CO., LTD.)

[Chem 27]

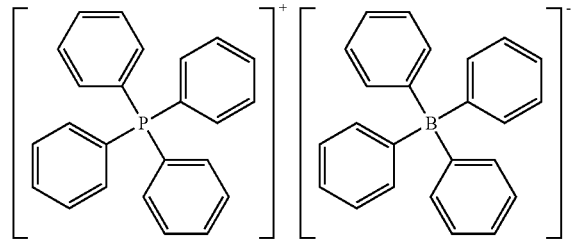

(D2); Compound (DBU) represented by the following formula (manufactured by SAN-APRO LTD.)

[Chem 28]

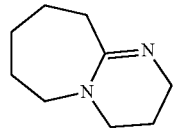

(D3); Compound (DBN) represented by the following formula (manufactured by SAN-APRO LTD.)

[Chem 29]

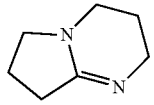

(D4); Curing accelerator for epoxy, U-CATSA102 (a phenol novolac resin salt of DBU, manufactured by SAN-APRO LTD.)

(D5); The curing accelerator to be used in Examples 1 to 5 an 16 to 19 was prepared according to the following procedure. DBU (manufactured by manufactured by SAN- APRO LTD.) and 4,4'-methylenediphenol (MDP) (manufactured by TOKYO CHEMICAL INDUSTRY CO., LTD.) were weighed into a 200 ml round-bottom flask equipped with a condenser, such that the molar ratio of DBU and MDP was 1:1. A stir bar was placed it the flask, and then the mixture was heated with stirring in an oil bath controlled at 100° C., to obtain a salt as pink crystals. The structural formula of the resulting salt is shown below.

[Chem 30]

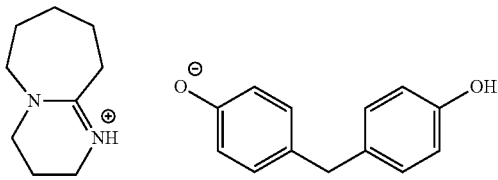

(D6); The curing accelerator to be used in Examples 6 and 7 as well as 20 and 2.1 was prepared in the same manner as (D5). DBU (manufactured by SAN-APRO LTD.) and bisphenol F (manufactured by HONSHU CHEMICAL INDUSTRY CO., LTD.) were heated with stirring, to obtain a salt as light pink crystals. The structural formula of the resulting salt is shown below.

[Chem 31]

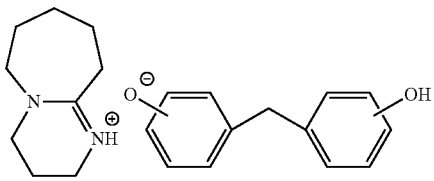

(D7); The curing accelerator to be used in Examples 8 and 22 was prepared in the same manner as (D5). DBU (manufactured by SAN-APRO LTD.) and bis(4-hydroxyphenyl) sulfide (manufactured by TOKYO CHEMICAL INDUSTRY CO., LTD.) were heated with stirring, to obtain a salt as white crystals. The structural formula of the resulting salt is shown below.

[Chem 32]

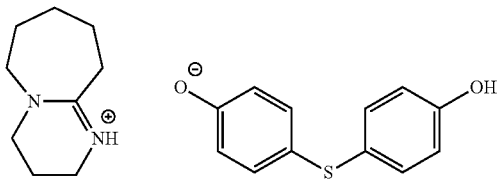

(D8); The curing accelerator to be used in Example 9 was prepared in the same manner as (D5). DBU (manufactured by SAN-APRO LTD.) and 4,4'-dihydroxybenzophenone (manufactured by TOKYO CHEMICAL INDUSTRY CO., LTD.) were heated with stirring, to obtain a salt as yellow crystals. The structural formula of the resulting salt is shown below.

[Chem 33]

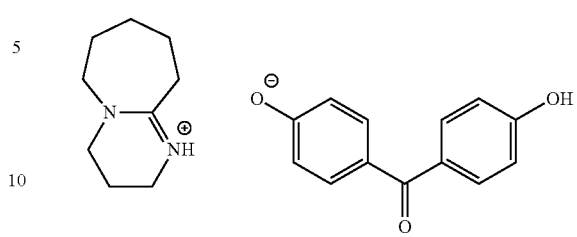

(D9); The curing accelerator to be used in Example 10 was prepared in the same manner as (D5). DBU (manufactured by SAN-APRO LTD.) and bisphenol AF (manufactured by TOKYO CHEMICAL INDUSTRY CO., LTD.) were heated with stirring, to obtain a salt as light brown crystals. The structural formula of the resulting salt is shown below.

[Chem 34]

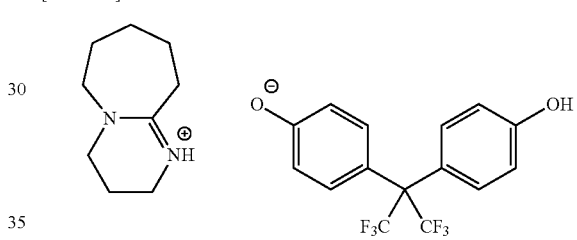

(D10); The curing accelerator to be used in Example 11 was prepared in the same manner as (D5). DBU (manufactured by SAN-APRO LTD.) and bisphenol AP (manufactured by TOKYO CHEMICAL INDUSTRY CO., LTD.) were heated with stirring, to obtain a salt as gray crystals. The structural formula of the resulting salt is shown below.

[Chem 35]

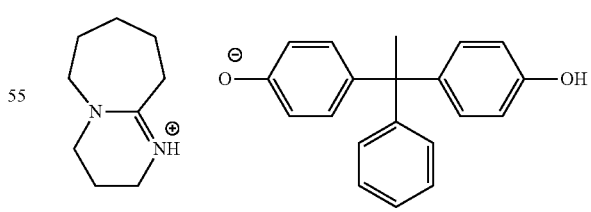

(D11); The curing accelerator to be used in Example 12 was prepared in the same manner as (D5). DBU (manufactured by SAN-APRO LTD.) and bisphenol BP (manufactured by TOKYO CHEMICAL INDUSTRY CO., LTD.) were heated with stirring, to obtain a salt as white crystals. The structural formula of the resulting salt is shown below.

[Chem 36]

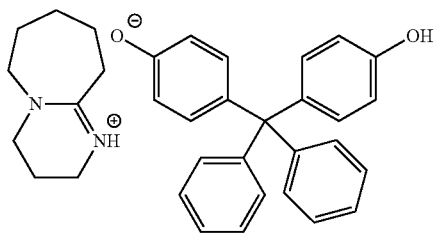

(D12); The curing accelerator to be used in Example 13 was prepared in the same manner as (D5). DBN (manufactured by SAN-APRO LTD.) and 4,4'-methylenediphenol (manufactured by TOKYO CHEMICAL INDUSTRY CO., LTD.) were heated with stirring, to obtain a salt as light pink crystals. The structural formula of the resulting salt is shown below.

[Chem 37]

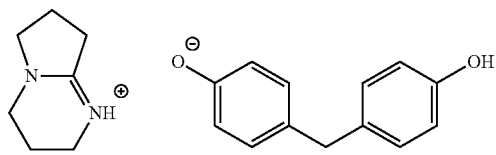

(D13); The curing accelerator to be used in Example 14 was prepared in the same manner as (D5). DBN (manufactured by SAN-APRO LTD.) and bisphenol F (manufactured by HONSHU CHEMICAL INDUSTRY CO., LTD.) were heated with stirring, to obtain a salt as white crystals. The structural formula of the resulting salt is shown below.

[Chem 38]

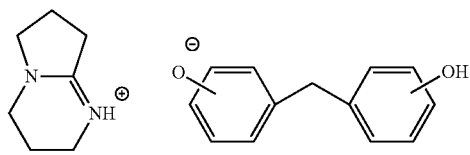

(D14); The curing accelerator to be used in Example IS was prepared in the same manner as (D5). DBN (manufactured by SAN-APRO LTD.) and bis(4-hydroxyphenyl)sulfide (manufactured by HONSHU CHEMICAL INDUSTRY CO., LTD.) were heated with stirring, to obtain a salt as white crystals. The structural formula of the resulting salt is shown below.

[Chem 39]

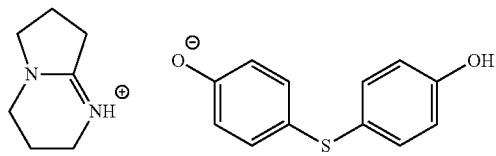

<Component (E); Inorganic Filler>

A fused spherical silica (FB-820, manufactured by DENKA COMPANY LIMITED) having an average particle size D50 of 22 μm was used as the component (E). Hereinafter, referred to as (E).

<Other Components>

Carnauba wax (manufactured by CLARIANT JAPAN K.K.) as a release agent and carbon black (MA600, manufactured by MITSUBISHI CHEMICAL CORPORATION) as a colorant were used.

Example 1

A curable resin composition (hereinafter, simply referred to as "composition") and a cured product were prepared as follows, and the thermophysical properties (the reaction start temperature and the reaction peak temperature) determined by differential scanning calorimetry (DSC) for evaluating the curability, and the glass transition temperature for evaluating the heat resistance were measured.

The components (A1), (B1), (C1) and (D5) were kneaded at the compounding ratio shown in Table 1 on a hot platen whose surface temperature was controlled at 100° C., under atmospheric pressure for 10 minutes, and then the resultant was cooled to room temperature to obtain a mixture. The mixture was crushed into a powder with a mortar, to obtain a composition.

<Thermophysical Properties Determined by Differential Scanning Calorimetry (DSC)>

Into an aluminum pan was introduced 10 mg of the composition, and the thermophysical properties of the composition was measured using a differential scanning calorimeter (DSC7020, manufactured by HITACHI HIGH-TECH SCIENCE CORPORATION), under a nitrogen gas stream, and under the conditions of a rate of temperature rise of 10° C./min and a temperature range of 30° C. to 300° C. The temperature at which the graph line starts to rise, in a temperature range of 100° C. or higher, was defined as the reaction start temperature, and the highest point in the graph was defined as the reaction peak temperature. When a reaction start temperature is too low, a reaction may start at a low temperature, possibly resulting in an excessive reactivity. On the other hand, when a reaction start temperature is too high, a reaction may not proceed sufficiently, possibly resulting in a poor reactivity. Further, when a reaction start temperature is too high, the gel time (namely, the curing time) during the curing becomes long, namely, the fast curability may deteriorate. A smaller difference between the reaction start temperature and the reaction peak temperature is more preferred, from the viewpoint of the management during the production process. The results are shown in Table 1. FIG. 1 shows the reaction start temperature and the reaction peak temperature in a typical measured result (one example) of DSC.

<Glass Transition Temperature; Tg>

Into an aluminum pan for use in DSC was weighed about 10 mg of the composition, and the composition was heated in an oven at 220° C. for 4 hours, to obtain a cured product. The Tg of the resulting cured product was measured by DSC, under the following conditions. The results are shown in Table 1.

Apparatus: X-DSC-7000 (manufactured by HITACHI HIGH-TECH SCIENCE CORPORATION)

Measurement conditions: flow rate of $N_2$; 20 mL/min, rate of temperature rise; 20° C./min <Compatibillty>

The components (A1), (B1) and (C1) were weighed according to the compounding ratio shown in Table 1, and melted at 200° C. to obtain a molten resin material. To the resulting molten resin material, the curing accelerator (D5) was added at the compounding ratio shown in Table 1, and whether or not the curing accelerator was compatible with the molten resin material was evaluated by visual observation, in accordance with the following criteria. The confirmation of the compatibility was performed by a panel of people with healthy eyesight (a visual acuity of 0.7 or more), under light with an illuminance of 300 to 2000 lux. The confirmation was performed by a panel of three people.

[Evaluation Criteria]

○: The curing accelerator was compatible with the molten resin material.

x: The curing accelerator was not compatible with the molten resin material, or the compatibility was insufficient.

A poor compatibility may lead to possibilities that the curing accelerator and the other components of the composition are separated to prevent the reaction from proceeding sufficiently and uniformly, and also that thereby causes variations in the characteristics of the resulting product and thus is not preferred.

Examples 2 to 15

The compositions of the Examples were prepared in the same manner as in Example 1, except that the compounding ratios of the respective components were varied as shown in Table 1. The thermophysical properties (the reaction start temperature and the reaction peak temperature) determined by DSC, the heat resistance (glass transition temperature) and the compatibility of each composition were measured in the same manner as in Example 1. The results are shown in Table 1.

Comparative Examples 1 to 5

The compositions of the Comparative Examples were prepared in the same manner as in Example 1, except that the compounding ratios of the respective components were varied as shown in Table 1. The thermophysical properties (the reaction start temperature and the reaction peak temperature) determined by DSC, the heat resistance (glass transition temperature) and the compatibility of each composition were measured in the same manner as in Example 1. The results are shown in Table 1. It is noted, however, that the curable resin compositions of Comparative Examples 3 and 4 started to be cured at the stage of kneading, namely, at a temperature of 100° C. or lower, and thus it was unable to perform the measurement of the reaction start temperature and the reaction peak temperature by a differential scanning calorimeter.

TABLE 1

| | | | | | | | Examples | | | | | | |
| --- | --- | --- | --- | --- | --- | --- | --- | --- | --- | --- | --- | --- | --- |
| | | | | 1 | 2 | 3 | 4 | 5 | 6 | 7 | 8 | 9 | 10 |
| Component (parts by mass) | Multifunctional Benzoxazine Compound | (A1) | | 46 | | 46 | 46 | 46 | 46 | 46 | 46 | 46 | 46 |
| | | (A2) | | | 46 | | | | | | | | |
| | Multifunctional Epoxy Compound | (B1) | | 37 | 37 | 38 | | | 37 | 38 | 37 | 37 | 37 |
| | | (B2) | | | | | 37 | | | | | | |
| | | (B3) | | | | | | 37 | | | | | |
| | Curing Agent | (C1) | | 14 | 14 | | 14 | 14 | 14 | | 14 | 14 | 14 |
| | | (C2) | | | | 13 | | | | 13 | | | |
| | Curing Accelerator | (D1) | | | | | | | | | | | |
| | | (D2) | | | | | | | | | | | |
| | | (D3) | | | | | | | | | | | |
| | | (D4) | | | | | | | | | | | |
| | | (D5) | | 3 | 3 | 3 | 3 | 3 | | | | | |
| | | (D6) | | | | | | | 3 | 3 | | | |
| | | (D7) | | | | | | | | | 3 | | |
| | | (D8) | | | | | | | | | | 3 | |
| | | (D9) | | | | | | | | | | | 3 |
| | | (D10) | | | | | | | | | | | |
| | | (D11) | | | | | | | | | | | |
| | | (D12) | | | | | | | | | | | |
| | | (D13) | | | | | | | | | | | |
| | | (D14) | | | | | | | | | | | |
| Performance Evaluation | Reaction Starting Temperature | | [° C.] | 145 | 153 | 151 | 142 | 149 | 143 | 140 | 186 | 155 | 154 |
| | Reaction Peak Temperature | | [° C.] | 200 | 213 | 212 | 203 | 210 | 201 | 214 | 215 | 213 | 211 |
| | Glass Transition Temperature | | [° C.] | 255 | 243 | 253 | 262 | 241 | 253 | 254 | 245 | 254 | 250 |
| | Compatibility (visual observation) | | | ○ | ○ | ○ | ○ | ○ | ○ | ○ | ○ | ○ | ○ |

TABLE 1-continued

|  |  |  | Examples |  |  |  |  | Comparative Examples |  |  |  |  |
|---|---|---|---|---|---|---|---|---|---|---|---|---|
|  |  |  | 11 | 12 | 13 | 14 | 15 | 1 | 2 | 3 | 4 | 5 |
| Component (parts by mass) | Multifunctional Benzoxazine Compound | (A1) | 46 | 46 | 46 | 46 | 46 | 48 | 46 | 46 | 46 | 46 |
|  |  | (A2) |  |  |  |  |  |  |  |  |  |  |
|  | Multifunctional Epoxy Compound | (B1) | 37 | 37 | 37 | 37 | 37 | 38 | 37 | 37 | 37 | 37 |
|  |  | (B2) |  |  |  |  |  |  |  |  |  |  |
|  |  | (B3) |  |  |  |  |  |  |  |  |  |  |
|  | Curing Agent | (C1) | 14 | 14 | 14 | 14 | 14 | 14 | 14 | 14 | 14 | 14 |
|  |  | (C2) |  |  |  |  |  |  |  |  |  |  |
|  | Curing Accelerator | (D1) |  |  |  |  |  |  | 3 |  |  |  |
|  |  | (D2) |  |  |  |  |  |  |  | 3 |  |  |
|  |  | (D3) |  |  |  |  |  |  |  |  | 3 |  |
|  |  | (D4) |  |  |  |  |  |  |  |  |  | 3 |
|  |  | (D5) |  |  |  |  |  |  |  |  |  |  |
|  |  | (D6) |  |  |  |  |  |  |  |  |  |  |
|  |  | (D7) |  |  |  |  |  |  |  |  |  |  |
|  |  | (D8) |  |  |  |  |  |  |  |  |  |  |
|  |  | (D9) |  |  |  |  |  |  |  |  |  |  |
|  |  | (D10) | 3 |  |  |  |  |  |  |  |  |  |
|  |  | (D11) |  | 3 |  |  |  |  |  |  |  |  |
|  |  | (D12) |  |  | 3 |  |  |  |  |  |  |  |
|  |  | (D13) |  |  |  | 3 |  |  |  |  |  |  |
|  |  | (D14) |  |  |  |  | 3 |  |  |  |  |  |
| Performance Evaluation | Reaction Starting Temperature | [° C.] | 155 | 155 | 148 | 184 | 148 | 216 | 195 | <100 | <100 | 153 |
|  | Reaction Peak Temperature | [° C.] | 214 | 212 | 213 | 215 | 213 | 233 | 218 | — | — | 215 |
|  | Glass Transition Temperature | [° C.] | 251 | 253 | 255 | 248 | 251 | 236 | 250 | — | — | 234 |
|  | Compatibility (visual observation) |  | ○ | ○ | ○ | ○ | ○ | ○ | x | ○ | ○ | x |

—: unable to measure

Example 16

A curable resin composition (hereinafter, simply referred to as "composition") and a cured product were prepared as follows, and the gel time for evaluating the curability and the glass transition temperature for evaluating the heat resistance were measured.

The components (A1), (B1), (C1), (D5) and (E), carnauba wax, and carbon black were kneaded, at the compounding ratio shown in Table 2, using a heat roll kneader (BR-150HCV, AIMEX CO., Ltd.) including two rolls having surface temperatures of 90° C. and 100° C., respectively, under atmospheric pressure for 10 minutes, and then the resultant was cooled to room temperature to obtain a mixture. The mixture was crushed into a powder with Mini Speed Mill MS-09 (manufactured by LABONECT CO., Ltd.) so that packing into a mold can be favorably performed, thereby obtaining a composition.

<Gel Time>

In accordance with the gelation time method B (the flat plate method) defined in JIS K6910 (2007), the composition was placed on a hot plate controlled at 200° C., and stirred using a spatula. The time (seconds) taken until the thermosetting reaction proceeded and the fluidity was lost so much as to make the composition impossible to stir was measured as the gel time. A gel time having a smaller value indicates a faster speed of curing and more excellent fast curability. The results are shown in Table 2.

<Glass Transition Temperature; Tg>

A transfer molding machine was used to cure the composition prepared, under the conditions of a mold temperature of 200° C., an injection pressure of 4 MPa and a curing time of 3 minutes, and the resultant was subjected to heating as a post-curing treatment in an oven at 240° C. for 4 hours, thereby producing a cured product having a size of 3 mm vertical×3 mm horizonal×15 mm length. The cured product was cut into a test piece having a size of 3 mm vertical×3 mm horizonal×2 mm length, and the test piece was used to measure Tg by DSC under the following conditions. The results are shown in Table 2.

Apparatus: X-DSC-7000 (manufactured by HITACHI HIGH-TECH SCIENCE CORPORATION)

Measurement conditions: flow rate of $N_2$; 20 mL/min, rate of temperature rise; 20° C./min Examples 17 to 22

The compositions of the Examples were prepared in the same manner as in Example 16, except that the compounding ratios of the respective components were varied as shown in Table 2. The gel time and the heat resistance (glass transition temperature) of each composition were measured in the same manner as in Example 16. The results are shown in Table 2.

Comparative Examples 6 to 7

The compositions of the Comparative Examples were prepared in the same manner as in Example 16, except that the compounding ratios of the respective components were varied as shown in Table 2. The gel time and the heat resistance (glass transition temperature) of each composition were measured in the same manner as in Example 16. The results are shown in Table 2.

TABLE 2

|  |  |  | Examples | | | | | | | Comparative Example | |
|---|---|---|---|---|---|---|---|---|---|---|---|
|  |  |  | 16 | 17 | 18 | 19 | 20 | 21 | 22 | 6 | 7 |
| Component (parts by mass) | Multifunctional Benzoxazine Compound | (A1) | 6.7 |  | 6.7 | 6.7 | 6.7 | 6.7 | 6.7 | 6.9 | 6.7 |
|  |  | (A2) |  | 6.6 |  |  |  |  |  |  |  |
|  | Multifunctional Epoxy Compound | (B1) | 5.3 | 5.3 |  |  | 5.3 | 5.3 | 5.3 | 5.5 | 5.3 |
|  |  | (B2) |  |  | 5.3 |  |  |  |  |  |  |
|  |  | (B3) |  |  |  | 5.3 |  |  |  |  |  |
|  | Curing Agent | (C1) | 1.9 | 1.9 | 1.9 | 1.9 | 1.9 |  | 1.9 | 2.0 | 1.9 |
|  |  | (C2) |  |  |  |  |  | 1.9 |  |  |  |
|  | Curing Accelerator | (D1) |  |  |  |  |  |  |  |  | 0.5 |
|  |  | (D5) | 0.5 | 0.5 | 0.5 | 0.5 |  |  |  |  |  |
|  |  | (D6) |  |  |  |  | 0.5 | 0.5 |  |  |  |
|  |  | (D7) |  |  |  |  |  |  | 0.5 |  |  |
|  | Inorganic Filler | (E) | 85.0 | 85.0 | 85.0 | 85.0 | 85.0 | 85.0 | 85.0 | 85.0 | 85.0 |
|  | Carnauba Wax (mold release agent) | — | 0.3 | 0.3 | 0.3 | 0.3 | 0.3 | 0.3 | 0.3 | 0.3 | 0.3 |
|  | Carbon Black (colorant) | — | 0.3 | 0.3 | 0.3 | 0.3 | 0.3 | 0.3 | 0.3 | 0.3 | 0.3 |
| Performance Evaluation | Gel Time (200° C.) | [Sec] | 38 | 51 | 41 | 40 | 37 | 38 | 40 | >180 | 61 |
|  | Glass Transition Temperature | [° C.] | 259 | 252 | 252 | 250 | 258 | 259 | 255 | 233 | 245 |

The invention claimed is:

1. A curable resin composition, containing:

(A) a multifunctional benzoxazine compound having at least two benzoxazine rings, the compound being at least one multifunctional benzoxazine compound selected from a multifunctional benzoxazine compound having a structural unit of formula (1) and a multifunctional benzoxazine compound represented by a structure of formula (2), (B) a multifunctional epoxy compound having at least one norbornane structure and at least two epoxy groups, (C) a curing agent, and (D) a curing accelerator which is a bisphenol salt of a diazabicycloalkene;

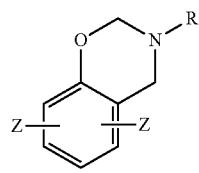

(1)

wherein in the formula (1), R represents a linear alkyl group having 1 to 12 carbon atoms, a cyclic alkyl group having 3 to 8 carbon atoms, or an aryl group having 6 to 14 carbon atoms, where the aryl group optionally has halogen or a linear alkyl group having 1 to 12 carbon atoms, as a substituent; and each Z represents hydrogen, a hydrocarbon group having 1 to 8 carbon atoms and/or a linking group and is optionally the same or different, at least one Z represents a linking group, and benzoxazine rings are linked by the linking group;

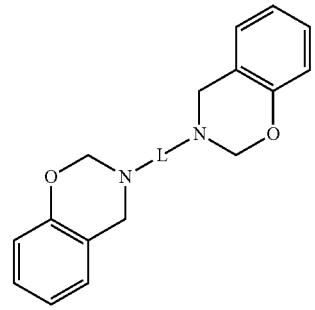

(2)

wherein in the formula (2), L represents a divalent organic group having 1 to 5 aromatic rings or an alkylene group having 1 to 10 carbon atoms, and the organic group and the alkylene group optionally comprise oxygen and/or sulfur.

2. The curable resin composition according to claim 1, wherein the curing accelerator (D) is represented by a structure of formula (9) or (10):

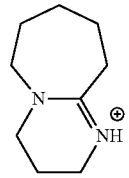 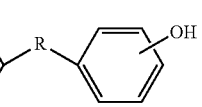

(9)

wherein in the formula (9), R represents an alkylene group optionally having a substituent, a carbonyl group, a sulfonyl group or a sulfide bond;

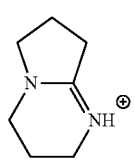 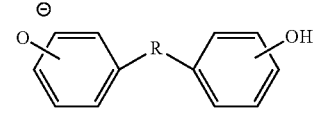

(10)

wherein in the formula (10), R represents an alkylene group optionally having a substituent, a carbonyl group, a sulfonyl group or a sulfide bond.

3. The curable resin composition according to claim 2, further containing (E) an inorganic filler.

4. The curable resin composition according to claim 3, wherein the curing agent (C) is at least one selected from the group consisting of imidazoles, aromatic amines and multifunctional phenols.

5. A cured product obtained by curing the curable resin composition according to claim 4.

6. A semiconductor device, wherein a semiconductor element is disposed in a cured product obtained by curing the curable resin composition according to claim 4.

7. A cured product obtained by curing the curable resin composition according to claim 2.

8. A semiconductor device, wherein a semiconductor element is disposed in a cured product obtained by curing the curable resin composition according to claim 2.

9. The curable resin composition according to claim 1, further containing (E) an inorganic filler.

10. The curable resin composition according to claim 9, wherein the curing agent (C) is at least one selected from the group consisting of imidazoles, aromatic amines and multifunctional phenols.

11. A cured product obtained by curing the curable resin composition according to claim 9.

12. A semiconductor device, wherein a semiconductor element is disposed in a cured product obtained by curing the curable resin composition according to claim 9.

13. The curable resin composition according to claim 1, wherein the curing agent (C) is at least one selected from the group consisting of imidazoles, aromatic amines and multifunctional phenols.

14. A cured product obtained by curing the curable resin composition according to claim 13.

15. A semiconductor device, wherein a semiconductor element is disposed in a cured product obtained by curing the curable resin composition according to claim 13.

16. A cured product obtained by curing the curable resin composition according to claim 1.

17. A semiconductor device, wherein a semiconductor element is disposed in a cured product obtained by curing the curable resin composition according to claim 1.

18. A method of producing a curable resin composition, the method comprising the steps of: mixing (A) a multifunctional benzoxazine compound having at least two benzoxazine rings, the compound being at least one multifunctional benzoxazine compound selected from a multifunctional benzoxazine compound having a structural unit of formula (1) and a multifunctional benzoxazine compound represented by a structure of formula (2), (B) a multifunctional epoxy compound having at least one norbornane structure and at least two epoxy groups, (C) a curing agent, and (D) a curing accelerator which is a bisphenol salt of a diazabicycloalkene, to obtain a mixture; and processing the mixture into a powdery, pelletized, or granular curable resin composition;

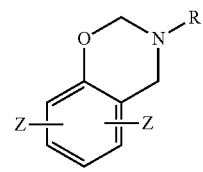

wherein in the formula (1), R represents a linear alkyl group having 1 to 12 carbon atoms, a cyclic alkyl group having 3 to 8 carbon atoms, or an aryl group having 6 to 14 carbon atoms, where the aryl group optionally has halogen or a linear alkyl group having 1 to 12 carbon atoms, as a substituent; and each Z represents hydrogen, a hydrocarbon group having 1 to 8 carbon atoms and/or a linking group and is optionally the same or different, at least one Z represents a linking group, and benzoxazine rings are linked by the linking group;

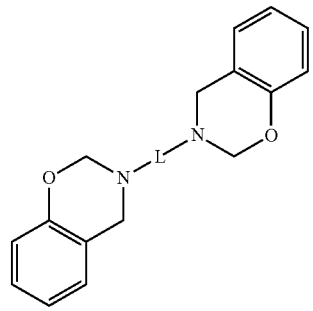

wherein in the formula (2), L represents a divalent organic group having 1 to 5 aromatic rings or an alkylene group having 1 to 10 carbon atoms, and the organic group and the alkylene group optionally comprise oxygen and/or sulfur.

19. The production method according to claim 18, wherein the step of obtaining a mixture comprises further mixing (E) an inorganic filler to obtain the mixture.

20. A method of producing a cured product, the method comprising a step of heating the curable resin composition produced by the method according to claim 18, at 180 to 300° C., for curing.

21. The method according to claim 18, wherein the curing accelerator (D) is represented by a structure of formula (9) or (10):

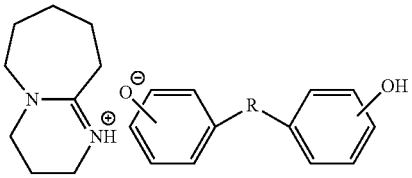

wherein in the formula (9), R represents an alkylene group optionally having a substituent, a carbonyl group, a sulfonyl group or a sulfide bond;

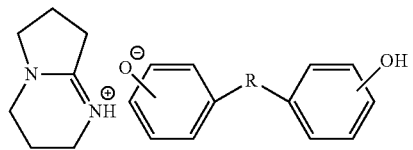
(10)
wherein in the formula (10), R represents an alkylene group optionally having a substituent, a carbonyl group, a sulfonyl group or a sulfide bond.
* * * * *